United States Patent [19]
Koblitz et al.

[11] Patent Number: 5,334,954
[45] Date of Patent: Aug. 2, 1994

[54] PHASE LOCKED LOOP CIRCUIT

[75] Inventors: Rudolf Koblitz; Kuno Lenz, both of Meylan, Fed. Rep. of Germany

[73] Assignee: Deutsche Thomson-Brandt GmbH, Fed. Rep. of Germany

[21] Appl. No.: 980,946

[22] Filed: Nov. 25, 1992

Related U.S. Application Data

[63] Continuation of PCT/EP91/00750, Apr. 19, 1991.

[30] Foreign Application Priority Data

Apr. 28, 1990 [DE] Fed. Rep. of Germany ....... 4013694

[51] Int. Cl.$^5$ ......................... H03L 7/107; H04N 5/04
[52] U.S. Cl. ......................... 331/20; 331/10; 331/14; 331/17; 331/25; 348/500; 348/536
[58] Field of Search ......................... 331/10, 14, 17, 20, 331/25, DIG. 2; 358/148, 150, 158

[56] References Cited

U.S. PATENT DOCUMENTS

| | | |
|---|---|---|
| 4,156,855 | 5/1979 | Crowley ............................. 331/1 A |
| 4,214,260 | 7/1980 | van Straaten ......................... 358/17 |
| 4,835,610 | 5/1989 | Dieterle et al. .................. 358/159 X |

FOREIGN PATENT DOCUMENTS

| | | |
|---|---|---|
| 0140567 | 5/1985 | European Pat. Off. ........ H03L 7/10 |
| 0314219 | 5/1989 | European Pat. Off. ........ H04N 5/12 |

*Primary Examiner*—David Mis
*Attorney, Agent, or Firm*—Joseph S. Tripoli; Joseph J. Laks; Daniel E. Sragow

[57] ABSTRACT

A phase control circuit for controlling the relative phase of periodic components of two logic signals having the same frequency, and one of which periodic components has a pulse-duty factor different from 50:50, said circuit includes a signal source which provides a control signal for regulating the relative phase of the periodic components of said logic signals. The control signal has a first value for phase relationships in a predetermined range of values and a second value for phase relationships outside said range of values. A phase lock detector detects the lock status of the periodic components of the logic signals. Another signal source provides a third logic signal having a periodic component having the same frequency as the periodic component of each of the two logic signals and a pulse width substantially wider than that of the two logic signals. A switch is actuated by the phase lock detector and applies the third logic signal to the signal source when the two logic signals are out-of-lock whereby the control signal has the first value when the two logic signals are phase locked and the second value when the two logic signal are not phase locked.

7 Claims, 2 Drawing Sheets

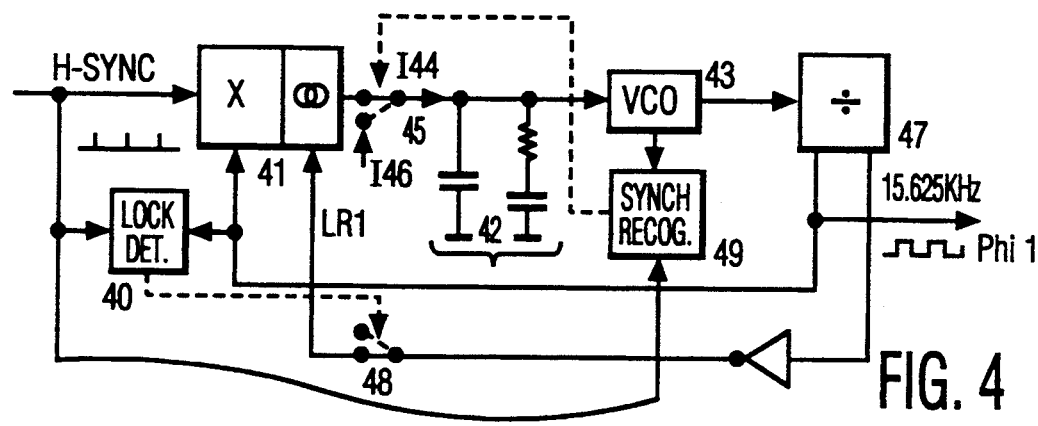
FIG. 4
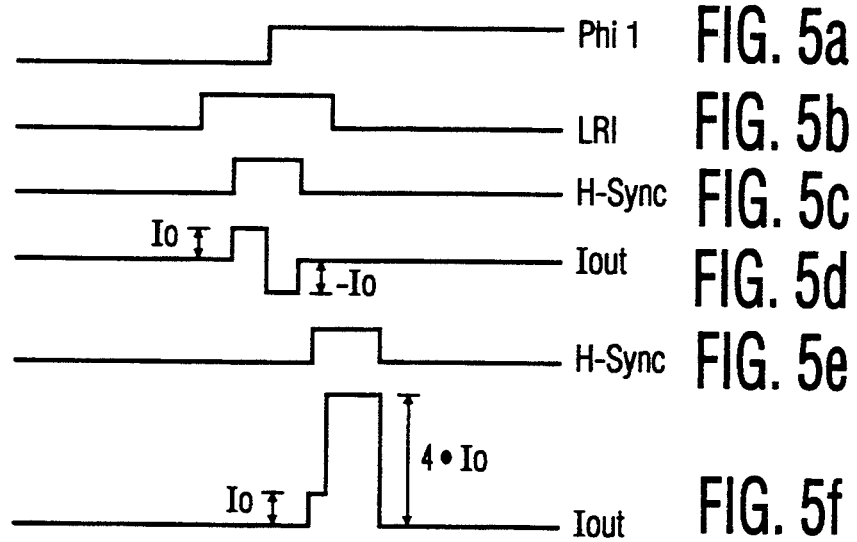
FIG. 5a
FIG. 5b
FIG. 5c
FIG. 5d
FIG. 5e
FIG. 5f
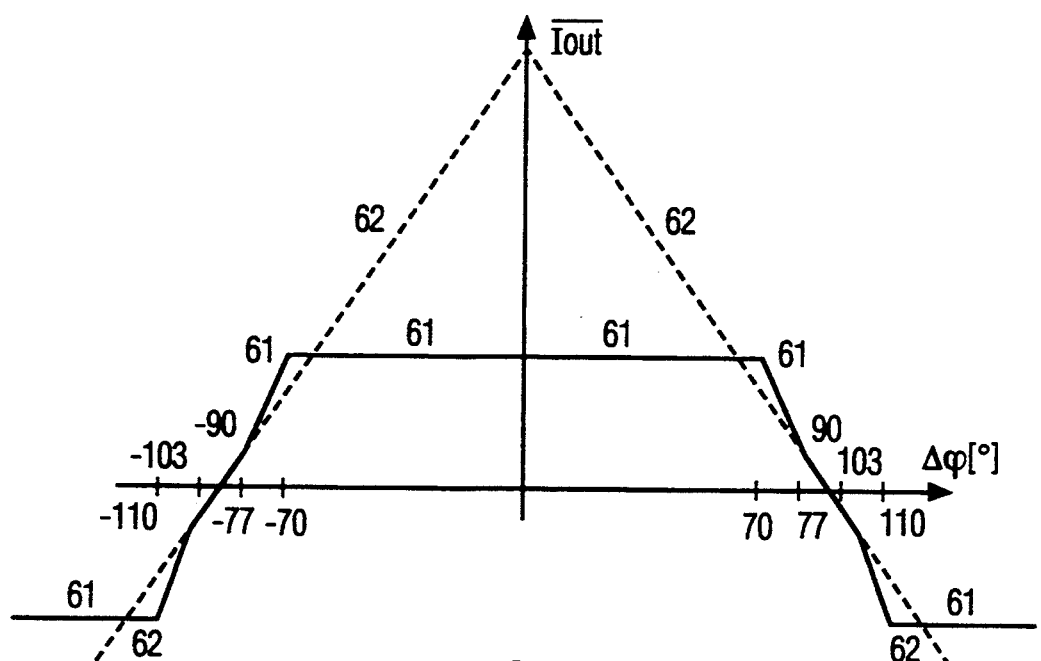
FIG. 6

PHASE LOCKED LOOP CIRCUIT

This is a continuation of PCT application PCT/EP 91/00750 filed Apr. 19, 1991 by Rudolf Koblitz and Kuno Lenz and titled "Phase Control Circuit".

FIELD OF INVENTION

This invention is directed to a phase control circuit, and is particularly useful in television receivers. Present day television receivers use a PLL (phase locked loop) circuit for line synchronization in the horizontal oscillator. The horizontal oscillator generates a Phil signal having a periodic component having the same frequency as the horizontal synchronization pulse (H-sync). However, the scanning ratios of the Phil and the H-sync signals are different.

For example, when another program source is switched on, or a change of station is executed, the line synchronization in the horizontal oscillator should occur as quickly as possible in order to avoid a distorted image disturbing the viewer and to bring the components of the television receiver which are controlled by the Phil signal quickly into a defined state of operation.

In order to ensure good regulating characteristics of the PLL in the locked state the characteristic curve of the PLL regulation should have certain properties, for example, a larger regulation time constant (control rate), so that, for example, noise superimposed upon the television signal generates no jitter in the PLL regulating loop in spite of the, in principle, temporal precision of the synchronizing pulses. In the unlocked state, however, the PLL should lock quickly. This requires a small control rate constant. However, because the H-sync duration (e.g. 4.7 $\mu S$) is relatively short compared to the line duration (e.g. 64 $\mu s$) the regulating characteristics of the PLL are non-linear (scanning ratio of the PLL input signals 4.7:64). Accordingly, over a wide phase range the control rate is independent of the amount of phase deviation, and the PLL locks relatively slowly in case of larger phase deviations, even when a time constant switch-over to the VCR mode (3 times faster) is carried out.

FIG. 1 shows a prior art PLL regulation circuit. A phase comparator 11 receives the H-sync and the Phil signal as input signals. The output of the phase comparator 11 contains a current source for the control current $I_{out}$. Control current $I_{out}$ is low pass filtered in a loop filter 12 and fed to a VCO 13 (voltage controlled oscillator). The VCO 13 contains a frequency divider and supplies a Phil signal at its output terminal. The Phil signal is at line frequency (e.g. 15.625 KHz). In the locked state the H-sync and the Phil signal are locked in phase.

FIG. 2 shows the H-sync, the Phil signal and the control current $\overline{I_{out}}$. The left half of the figure shows the locked state. The Phil signal and the H-sync have a phase shift $\Delta \phi$ of $+90°$ or $-90°$, and the resulting average control current has the value 0. The right half of the figure shows a non-locked state. In large phase difference ranges the amount of the control current $\overline{I_{out}}$ is independent of the phase position of the Phil signal.

This correlation is illustrated in FIG. 3 in solid lines. Only in relatively small phase difference ranges of $\Delta \phi$ (approximately $-103° \ldots -77°$, $77° \ldots 103°$) the average control current $\overline{I_{out}}$ changes as a function of the phase deviation of the Phil signal, i.e. a larger phase deviation causes a larger average control current $I_{out}$. In the range of $-77° \ldots 77°$ a relatively large phase deviation of the Phil signal results in a relatively small constant average control current $I_{out}$ although it should become larger with larger phase deviation. Consequently, it takes relatively long for the PLL to regulate a larger phase deviation. This leads to the above mentioned disadvantages. On the other hand, a general increase of the control current $I_{out}$ leads to unfavorable regulating characteristics in the locked state in case of a noisy input signal. In addition, a general increase of the average control current which is too strong can cause the control loop to oscillate.

It is an object of the invention to provide fast locking of the PLL without changing the regulating characteristic curve of the PLL in the locked state even in the case of a large phase deviation between the H-sync and the Phil signals.

A characteristic curve such as that shown in FIG. 3 by the dotted line, and which is always present with conventional PLL circuits, and having a scanning ratio of the input signals 1:1 would be ideal. The control current for the VCO is increased in an extended phase deviation range (in the non-linear part of the PLL regulation characteristic curve) by a certain factor. To do this, a line-synchronous LRI (line retrace inhibit), pulse, which is available in many present-day television receivers is used, the LRI pulse has a prolonged pulse duration compared to the H-sync and, for example, suppresses interference signals during the non-visible part of the lines. It is also possible to use any other line-synchronous pulse which has a prolonged pulse duration compared to the H-sync in leiu of the LRI pulse.

BRIEF DESCRIPTION OF DRAWING

The invention described with reference to the drawings in which:

FIG. 4 is a preferred embodiment of the invention for a horizontal oscillator.

FIGS. 5a–f is are time diagrams of input and output signals of the phase comparator in the PLL circuit according to the invention.

FIG. 6 is a characteristic curve according to the invention for the average output current of the phase comparator as a function of the phase difference of the input signals.

FIGS. 1 through 3 are described above.

DESCRIPTION OF PREFERRED EMBODIMENTS

Figure 1:
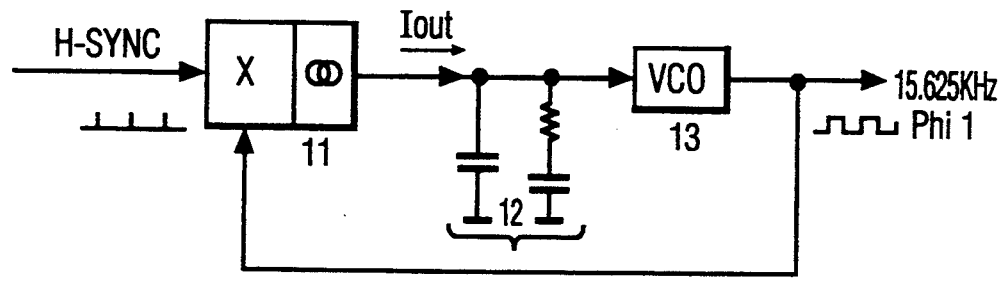
FIG. 1 is a prior art circuit for a horizontal oscillator.
Figure 2:
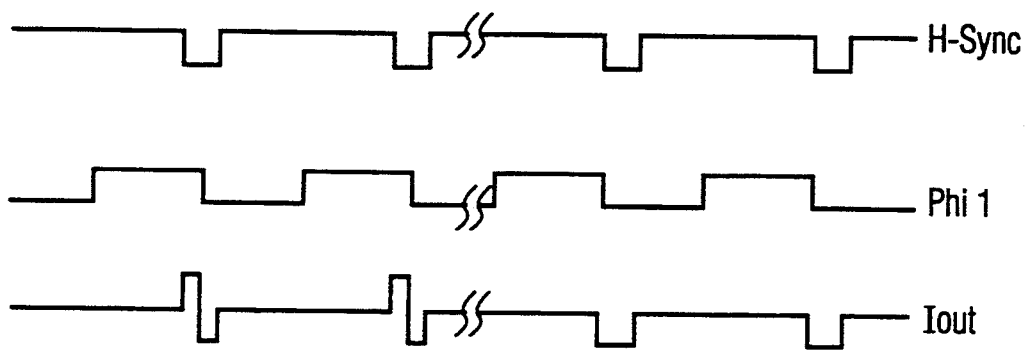
FIG. 2 shows time diagrams of input and output signals of the phase comparator in the prior art PLL.

FIG. 4 shows a phase comparator 41 which receives the H-sync, the Phil signal and an LRI signal as input signals. The output of the phase comparator 41 contains a controllable current source for the control current $I_{44}$. This control current is low pass filtered in the loop filter 42 and fed to a VCO 43. The VCO 43 supplies a 500 KHz output signal. A logic-frequency-divider circuit 47 generates the LRI and Phil signals. The Phil signal has line frequency of 15.625 KHz, for example. The LRI signal is, as mentioned above, already available in many television receivers. Otherwise, it is easy for an expert in the art to derive it from other signals in the television device. This can be carried out by means of scanning counter states in the frequency divider circuit.

When no H-sync is present, for example, with the reproduction of teletext pages stored in the television device after the closing down of transmission, a switch over to a fixed control current 46 occurs by means of a switch 45. The information needed to initiate the switch over in the absence of a signal and is generated in an H-sync recognition circuit 49.

On reproduction of a video recorder signal, for example, the control current from the controllable current source within the phase comparator 41 may be increased by a factor of three so that wow and flutter of the video recorder or fields reproduced with different length (approximately $+/-1$ μs) can be better regulated (deviation controlled). The information concerning the video recorder operation can be supplied, for example, from a SCART socket to the phase comparator 41.

A lock detector 40 receives the H-sync and the PhiI signal as input signals and determines whether the PLL is locked. In the locked state, the H-sync and PhiI signals are phase locked and the switch 48 is open. In the unlocked state switch 48 is closed and the control current is increased in the control source by a factor of four, for example. This enables the PLL to regulate a phase deviation of the PhiI signal from the phase of the H-sync more quickly.

The H-sync pulses are shown in FIGS. 5c and 5e, the PhiI signal is shown in FIG. 5a, the LRI signal is shown in FIG. 5b and the control currents $I_{out}$ are shown in FIGS. 5d and 5f. The upper part of the figure shows the locked state. The PhiI signal of FIG. 5a and the H-sync of FIG. 5c have a phase shift $\Delta\phi$ of $+90°$ or $-90°$, and the resulting average control current $\overline{I_{out}}$ has the value 0 ($+IO$ and $-IO$ averaged). FIG. 5f shows the control current $I_{out}$ for the non-locked state. During the interval of the H-sync pulse of FIG. 5e, which lies outside the duration of the LRI pulse of FIG. 5b, the control current $I_{out}$ is increased by the factor four as is shown in FIG. 5f. When, however, the phase of the H-sync shown in FIG. 5c lies within the duration of the LRI pulse, the control current $I_{out}$ remains unchanged, as shown by FIG. 5d.

Figure 3:
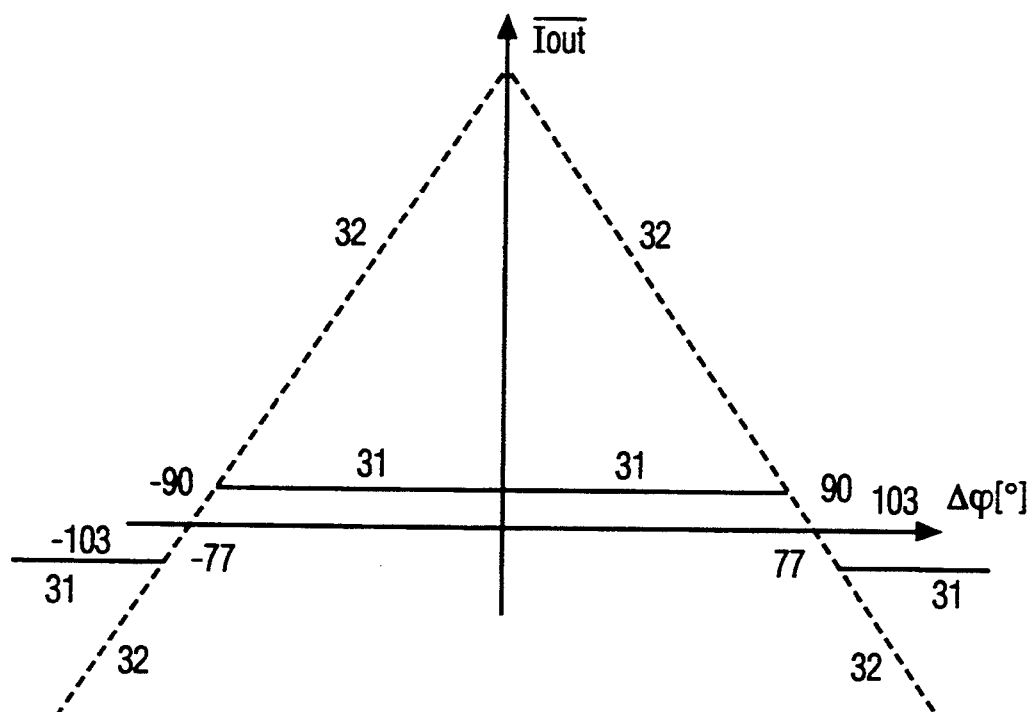
FIG. 3 shows the characteristic curve for the average output current of the phase comparator as a function of the phase difference of the input signals for a prior art PLL.

The characteristic curve shown in FIG. 6 represents the control current $I_{out}$ as a function of the phase deviation $\Delta\phi$. In the ranges $-103° \ldots -77° \ldots 103°$ the characteristic curve is identical with that shown in FIG. 3. In the ranges of approximately $<-110°, -70° \ldots 70°$ and $>110°$, however, the control current $I_{out}$ is advantageously increased by the factor 4 with respect to the characteristic curve in FIG. 3. During operation with a video recorder the control current can then be increased by the factor 12 (3*4).

By virtue of the enlarged linear characteristic curve range ($-110° \ldots -70°, 70° \ldots 110°$) the PLL attains almost ideal characteristics (dotted lines), i.e. in the locked state the regulating characteristic is slow and the regulating characteristic becomes faster with increasing phase difference. The regulating characteristic in the remaining non-linear part ($<-110°, -70° \ldots 70°, >110°$) is advantageously improved by the evaluations at $-110°, -70°, 70°$ and $110°$. The average control current $\overline{I_{out}}$ which is formed from the control current $I_{out}$ by the filtering in the loop filter 42 can also be changed by modifying the transfer function of the loop filter 42 whereby the current source in the phase comparator outputs a steady current $I_{out}$.

The invention is suitable for application not only for PLL regulation in horizontal oscillator circuits but generally in PLL regulation with signals which do not have the ideal pulse-duty factor ratio of 50:50.

We claim:

1. A phase control circuit for controlling the phase of the periodic component of an output signal with respect to the periodic component of an input signal, comprising:

first means for providing a control signal to means for regulating said phase of said output signal, said control signal having a first value for phase relationships of said periodic component of said output signal with respect to said periodic component of said input signal in a predetermined range of values, and a second valve for phase relationships of said periodic component of said output signal to said periodic component of said input signal outside of said range of values;

a phase lock detector for detecting if the state of said respective phase relationship of said input and output signals is locked;

a signal source for providing a third signal having a periodic component having the same frequency as said components of said input and output signals and having a pulse width substantially wider than a pulse width of said input signal; and switch means actuated by said phase lock detector and responsive to said signal source for applying said third signal to said first means when said input and output signals are unlocked, whereby said control signal has said first value when said input and output signals are phase locked and said second value when said input and third signal pulse widths do not overlap.

2. The circuit of claim 1 wherein said control signal is a current.

3. The circuit of claim 2 wherein said first value is lower than said second value.

4. A method of controlling the phase relationship of at least two logic signals each having a periodic component of the same frequency, one of said logic signals having a pulse-duty factor different from 50:50 comprising the steps of:

providing a control signal to means for regulating said phase relationship of said periodic components of said logic signals, said control signal having a first value for phase relationships in a predetermined range of values and a second value for phase relationships outside said range of values;

detecting if the state of said phase relationship of said components of said logic signals is locked;

providing a third logic signal from a signal source, said third logic signal having a periodic component having the same frequency as said two logic signals and having a pulse width substantially wider than the pulse widths of said two logic signals;

actuating a switch in response to detection of the state of said phase relationship of said components of said logic signals to apply said third logic signal to said control signal when said two logic signals are out-of-lock, whereby said control signal has said first value when said two logic signals are phase locked and said second value when one of said two logic signals and said third signal do not overlap.

5. The method of claim 4 wherein said first value is lower than said second value.

6. The method of claim 5 wherein said first value occurs when the phase difference between said two logic signals is +90° to −90°, and said second value occurs when the phase difference is in the order of −110° to −103°, −77° to −70°, +70° to +77°, and +103° to 110°.

7. A phase locked loop circuit comprising:
a) a phase comparator, corresponding to the phase comparator of said loop, having first, second and third inputs, and an output;
b) a source of input pulses coupled to said first input of said phase comparator;
c) a controlled oscillator having a control input coupled to the output of said phase comparator, and an output coupled to said second input of said phase comparator;
d) a switch;
e) a source of pulses having a duration greater than the duration of said input pulses, said source being coupled to said third input of said phase comparator through said switch; and
f) means for detecting the lock status of said phase locked loop, and for causing said switch to couple said source of greater duration pulses to said third input of said phase comparator in response to an out-of-lock status of said loop, so as to increase the output of said phase comparator to said oscillator.

* * * * *